United States Patent
Dangelas et al.

(10) Patent No.: US 10,778,170 B2
(45) Date of Patent: Sep. 15, 2020

(54) AUTOMATIC GAIN CONTROL FOR PASSIVE OPTICAL NETWORK

(71) Applicant: Semtech Corporation, Camarillo, CA (US)

(72) Inventors: Virginijus Dangelas, Vilnius (LT); Igor Mazurkevic, Thornbury (GB); Ricardas Vadoklis, Wotton-Under-Edge (GB)

(73) Assignee: Semtech Corporation, Camarillo, CA (US)

( * ) Notice: Subject to any disclaimer, the term of this patent is extended or adjusted under 35 U.S.C. 154(b) by 87 days.

(21) Appl. No.: 16/186,533

(22) Filed: Nov. 10, 2018

(65) Prior Publication Data
US 2020/0153404 A1   May 14, 2020

(51) Int. Cl.
| | | |
|---|---|---|
| H03G 3/30 | (2006.01) | |
| H03F 3/08 | (2006.01) | |
| H04B 10/27 | (2013.01) | |

(52) U.S. Cl.
CPC .......... *H03G 3/3084* (2013.01); *H03F 3/08* (2013.01); *H04B 10/27* (2013.01); *H03F 2200/414* (2013.01); *H03F 2200/435* (2013.01); *H03F 2200/78* (2013.01)

(58) Field of Classification Search
CPC .................................................. H03G 3/3084
See application file for complete search history.

(56) References Cited

U.S. PATENT DOCUMENTS

| | | | | |
|---|---|---|---|---|
| 5,303,308 A | * | 4/1994 | Larsen | H04M 1/6016 333/14 |
| 5,369,711 A | * | 11/1994 | Williamson, III | H03G 3/3015 381/104 |
| 6,246,282 B1 | | 6/2001 | Oono et al. | |
| 2004/0145419 A1 | | 7/2004 | Nogami et al. | |
| 2006/0216042 A1 | * | 9/2006 | Yeo | H03G 3/3084 398/209 |
| 2007/0139118 A1 | * | 6/2007 | Teo | H03G 1/0088 330/279 |
| 2009/0029661 A1 | * | 1/2009 | Ao | H03G 3/3078 455/127.2 |
| 2016/0118970 A1 | * | 4/2016 | Kim | H03K 5/1532 |
| 2018/0033814 A1 | | 2/2018 | Chalmers, Jr. | |
| 2018/0234096 A1 | * | 8/2018 | Li | H03K 17/78 |

FOREIGN PATENT DOCUMENTS

EP      2388933 A1    11/2011

* cited by examiner

*Primary Examiner* — Patricia T Nguyen
(74) *Attorney, Agent, or Firm* — Robert D. Atkins; Patent Law Group: Atkins and Associates, P.C.

(57) ABSTRACT

An automatic gain control circuit controls a gain of a burst mode amplifier. A peak detector includes an input coupled to an output of the amplifier. A plurality of resistors is coupled in series between an input of the first amplifier and the output of the first amplifier for setting the gain of the amplifier. A first gain stage is responsive to an output signal of the peak detector for disabling a first resistor of the plurality of resistors to alter the gain of the first amplifier. A second gain stage is responsive to the output signal of the peak detector for disabling a second resistor of the plurality of resistors to alter the gain of the first amplifier. A comparator responsive to the output signal of the peak detector causes a pulse generator to enable the first gain stage and second gain stage each burst mode.

20 Claims, 4 Drawing Sheets

AUTOMATIC GAIN CONTROL FOR PASSIVE OPTICAL NETWORK

FIELD OF THE INVENTION

The present invention relates in general to a passive optical network and, more particularly, to fast automatic gain control for a burst mode transimpedance amplifier.

BACKGROUND OF THE INVENTION

A gigabit passive optical network (GPON) provides high speed data communications, over a fiber optical cable, between an internet service provider (ISP) and end user. A GPON uses point-to-multipoint architecture (1:32) with a fiber optic splitter to serve multiple end-points from a single optical source. For example, the GPON includes an optical line terminal (OLT) at the ISP central office or switching center and a plurality of optical network units (ONU) or optical network terminals (ONT) located near the end users. Each ONU serves an individual end user. The GPON is a shared network, in that the OLT sends a stream of data packets as downstream traffic that is seen by all ONUs. Each ONU reads the content of the data packets that correspond to the particular ONU address. Encryption prevents eavesdropping on downstream traffic. GPON does not need to provision individual fibers between the hub and customer.

The OLT may include a burst mode (BM) transimpedance amplifier (TIA) with an automatic gain control (AGC) in the data receive channel. FIG. 1 shows a conventional TIA 10 within the OLT and including front-end amplifier 12, single-ended to differential (SE2DIFF) amplifier 14, and common mode level (CML) driver 16 in the data receive channel. AGC 20 has an input coupled to the output of SE2DIFF amplifier 14 and an output controlling the gain of front-end amplifier 12. AGC 20 detects the signal level after SE2DIFF amplifier 14 and sets the gain of TIA 10.

Each data packet transfer through the OLT and ONU includes a guard time, followed by a preamble, and then the data payload. A settling time is needed for each data packet after the start of the preamble for TIA 10 to achieve lock or reach steady state operation. AGC 20 typically include circuits with low-pass filtering having a long time constant. As data speeds increase, the time contestant of conventional AGC 20 may exceed the time allocated for TIA 10 to reach steady state during the preamble. A faster AGC is needed for higher data speeds.

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, those skilled in the art will appreciate that the description is intended to cover alternatives, modifications, and equivalents as may be included within the spirit and scope of the invention as defined by the appended claims and the claims' equivalents as supported by the following disclosure and drawings.

Figure 1:
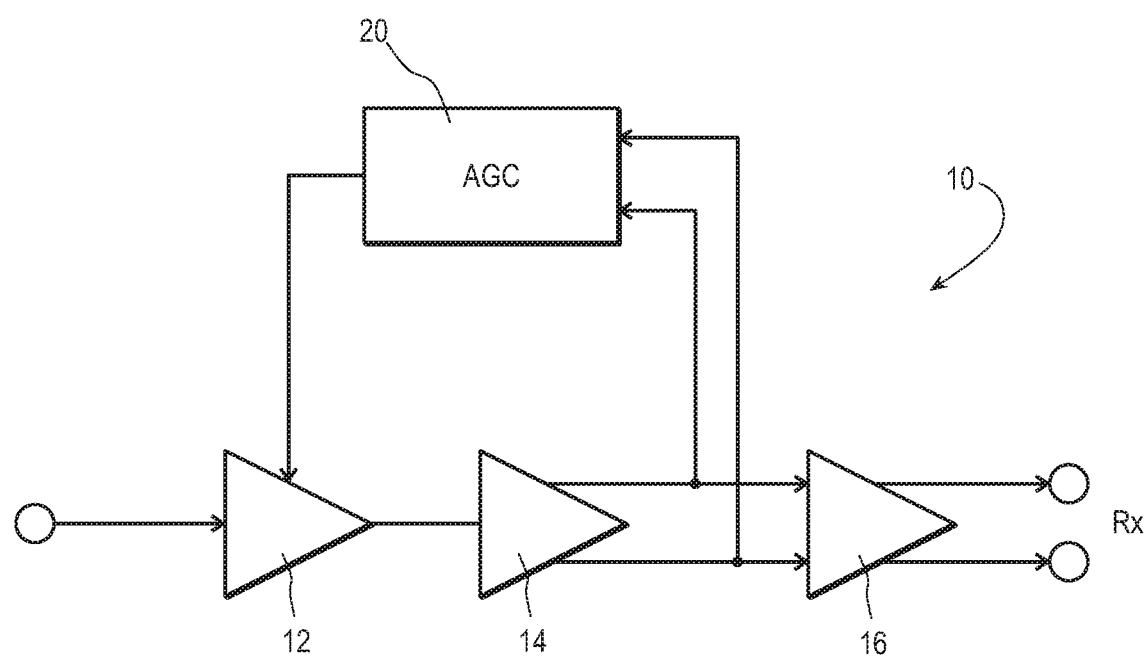
FIG. 1 illustrates a conventional transimpedance amplifier with automatic gain control.
Figure 2:
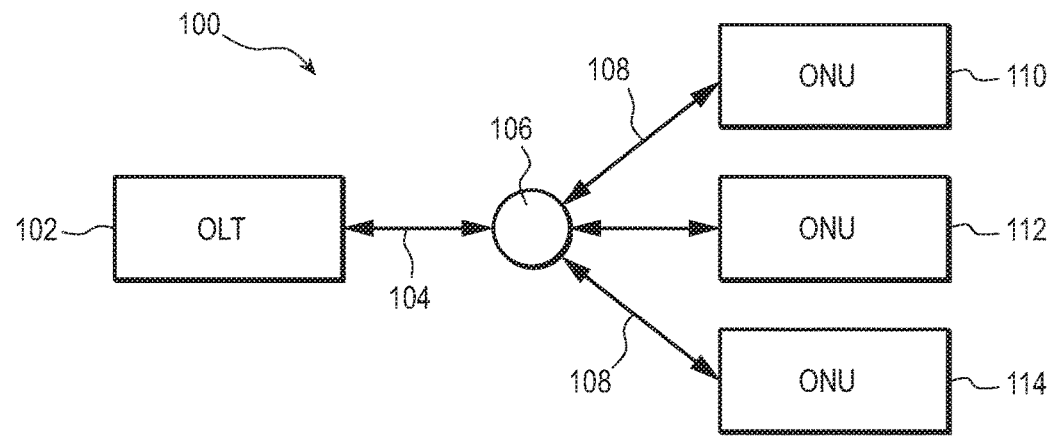
FIG. 2 illustrates a gigabit passive optical network with OLT, optical splitter, and a plurality of ONUs.

FIG. 2 illustrates GPON 100 providing high speed data communications, over fiber optical cable, between an ISP and end users. GPON 100 includes OLT 102 located within the ISP home office or switching center. OLT 102 makes connection with the internet. OLT 102 is coupled through fiber optical cable 104 to optical splitter 106, which provides multiple identical optical signal paths through fiber optical cables 108 to ONU 110, 112, and 114 located near end users. In one embodiment, optical splitter 106 connects up to 32 ONUs and brings optical fiber cabling and signals to the end user. GPON 100 is a shared network, in that OLT 102 sends a stream of data packets as downstream traffic through fiber optical cables 104 and 108 to ONU 110-114. Each ONU 110-114 reads the content of the data packets that correspond to the particular ONU address. Encryption prevents eavesdropping on downstream traffic.

Figure 3:
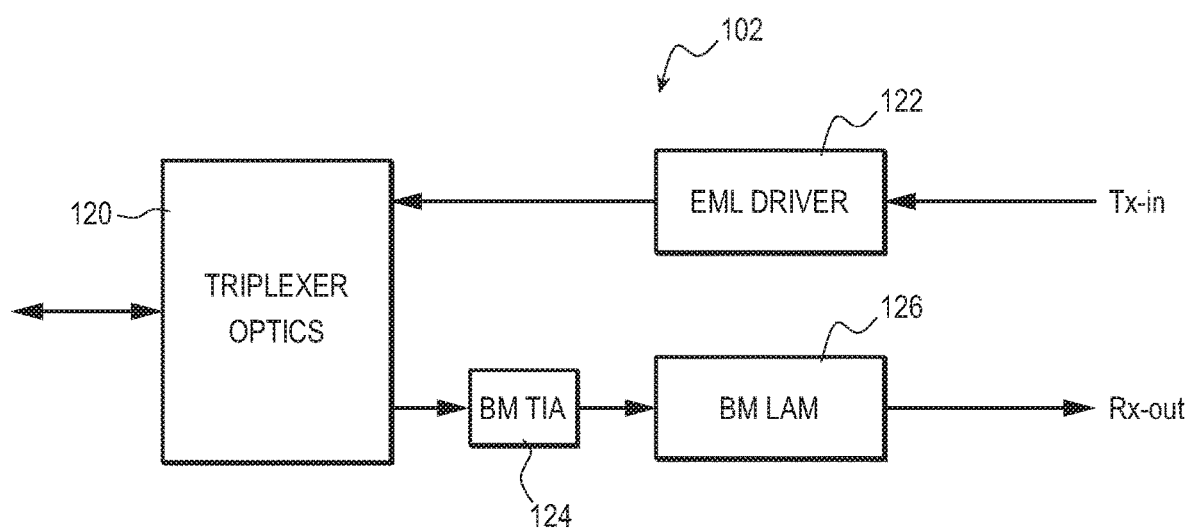
FIG. 3 illustrates further detail of the OLT of the GPON.

FIG. 3 shows further detail of OLT 102 including triplexer optics 120 coupled to the internet and electro-absorption modulator laser (EML) driver 122. EML driver 122 can also use an externally modulated laser or distributed feedback laser. An input of EML driver 122 is coupled to the transmit (Tx-in) channel from ONU 110-114. EML driver 122 operates up to 10 gigabits per second (10 G) and uses clock and data recovery (CDR) for the Tx-in channel. Triplexer optics 120 is further coupled to an input of burst mode (BM) transimpedance amplifier (TIA) 124. In one embodiment, BM TIA 124 operates up to 10 G. Alternatively, BM TIA 124 operates up to 1.25 G or 2.5 G. The output of BM TIA 124 is coupled to an input of BM limiting amplifier (LAM) 126, and the output of BM LAM 126 is coupled to the receive (Rx-out) channel to ONU 110-114. OLT 102 further includes a micro-control unit for controlling the data transfer.

Figure 4:
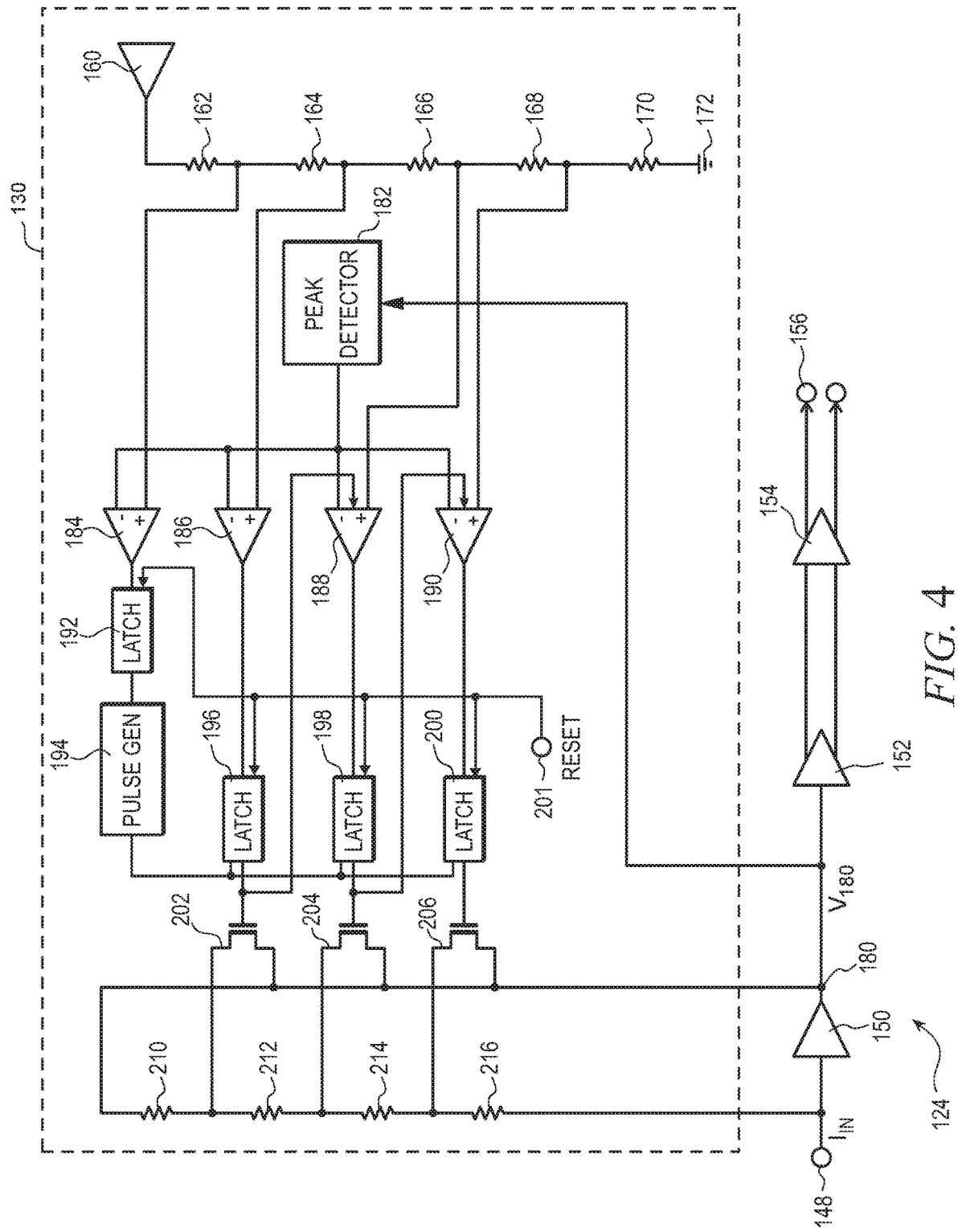
FIG. 4 illustrates an automatic gain control for the BM TIA within the OLT.

FIG. 4 illustrates further detail of BM TIA 124 with AGC 130. BM TIA 124 includes terminal 148 from triplexer optics 120 coupled to an input of front-end transimpedance amplifier 150. The input of front-end transimpedance amplifier 150 receives an input current $I_{IN}$ and the output provides an output voltage $V_{180}$ at node 180 that changes with the magnitude of the input current $I_{IN}$, although the relative polarities can be changed. In one embodiment, voltage $V_{180}$ decreases with an increasing input current $I_{IN}$. The output of front-end transimpedance amplifier 150 is coupled to an input of single-ended to differential (SE2DIFF) amplifier 152. SE2DIFF amplifier 152 has differential outputs coupled to the differential inputs of common mode level (CML) driver 154. The differential outputs of CML driver 154, shown as terminals 156, are coupled to the input of BM LAM 126 in the Rx-out channel.

AGC 130 includes front-end dummy amplifier 160 configured to operate in a similar manner as front-end amplifier 150 and provides a stable reference voltage, which is approximately the same as $V_{180}$, given zero input current $I_{IN}$. An output of front-end dummy amplifier 160 is coupled through resistor divider network 162, 164, 166, 168, and 170 to power supply terminal 172 operating at ground potential.

Peak detector 182 monitors the voltage $V_{180}$ at node 180. The output of peak detector 182 is coupled to an inverting input of comparators 184, 186, 188, and 190. The node between resistors 162 and 164 is coupled to a non-inverting input of comparator 184. The node between resistors 164 and 166 is coupled to a non-inverting input of comparator 186. The node between resistors 166 and 168 is coupled to a non-inverting input of comparator 188. The node between resistors 168 and 170 is coupled to a non-inverting input of comparator 184.

The output of comparator 184 is coupled to a data input of latch 192, and the output of latch 192 is coupled to an input of pulse generator 194. The output of comparator 186 is coupled to a data input of latch 196, the output of comparator 188 is coupled to a data input of latch 198, and the output of comparator 190 is coupled to a data input of latch 200. The output of latch 196 is coupled to an enable input of comparator 188, and the output of latch 198 is coupled to an enable input of comparator 190. Pulse generator 194 provides an enable signal to latches 196, 198, and 200. RESET at terminal 201 is coupled to the reset inputs of latches 192, 196, 198, and 200.

The output of latch 196 is further coupled to the gate of metal oxide semiconductor (MOS) transistor 202, the output of latch 198 is coupled to the gate of MOS transistor 204, and the output of latch 200 is coupled to the gate of MOS transistor 206. Resistors 210, 212, 214, and 216 are coupled in series between the input of front-end amplifier 150 and node 180. The drain of transistor 202 is coupled to the node between resistors 210 and 212, the drain of transistor 204 is coupled to the node between resistors 212 and 214, and the drain of transistor 206 is coupled to the node between resistors 214 and 216. The sources of transistors 202-206 are commonly coupled to node 180.

AGC 130 detects the peak voltage at node 180, and corresponding peak input current $I_{IN}$, and sets the gain of TIA 124 during a burst cycle. AGC 130 provides multiple stages of digital gain control for BM TIA 124, while providing a fast settling time. In the present example, AGC 130 provides four levels of gain control. Devices 190, 200, and 206 represent a first gain stage, devices 188, 198, and 204 represent a second gain stage, and devices 186, 196, and 202 represent a third gain stage. Additional gain stages, like 190, 200, and 206, provide more levels of gain control. Front-end dummy amplifier 160 mimics front-end amplifier 150 (provides same output voltage as node 180 at zero input current $I_{IN}$) and sets the AGC threshold levels for comparators 184-190.

That is, front-end dummy amplifier 160 establishes reference voltages for comparators 184-190. In one embodiment, front-end dummy amplifier 160 provides 1.7 volts to generate references voltages ranging from 40-800 millivolts (mv) for comparators 184-190. In 2.5 G and 10 G applications, resistors 162-168 are selected to generate references voltages of 40 mv, 200 mv, 250 mv, and 350 mv for comparators 184-190, respectively. In 1.25 G applications, resistors 162-168 are selected to generate references voltages of 40 mv, 300 mv, 500 mv, and 800 mv for comparators 184-190, respectively.

Figure 5:
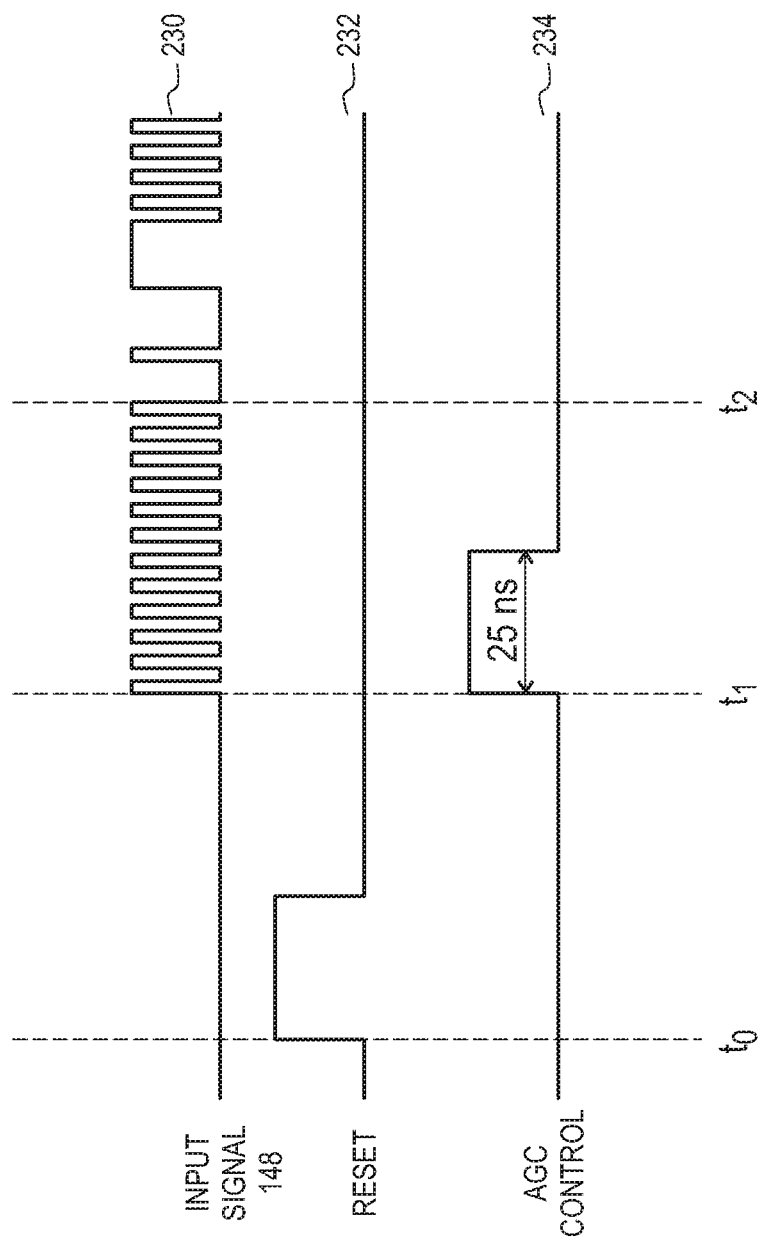
FIG. 5 illustrates a timing diagram of the automatic gain control.

Consider the operation of BM TIA 124 with AGC 130 during one burst mode data packet, see FIGS. 4 and 5. Time $t_0$ marks the start of a data packet. At time $t_0$, the RESET signal at terminal 201 goes to logic one and resets latches 192, 196, 198, and 200 to logic zero during guard time $t_0$-$t_1$ of the input signal 148 during the burst mode data packet, see waveforms 230 and 232. RESET 201 returns to logic zero before time $t_1$. The output of comparator 184 has a logic one when the output signal of peak detector 182 exceeds the reference voltage $V_{162}$. The output of comparator 186 is logic zero otherwise. The output of comparator 186 has a logic one when the output signal of peak detector 182 exceeds its reference voltage. The output of comparator 186 is logic zero otherwise. The output of comparator 188 has a logic one when enabled and the output signal of peak detector 182 exceeds its reference voltage. The output of comparator 188 is logic zero otherwise. The output of comparator 190 has a logic one when enabled and the output signal of peak detector 182 exceeds its reference voltage. The output of comparator 190 is logic zero otherwise.

Front-end transimpedance amplifier 150 receives input current $I_{IN}$ and provides a corresponding voltage $V_{180}$ to SE2DIFF amplifier 152 starting at time $t_1$. Times $t_1$-$t_2$ is the preamble portion of the burst mode data packet. Peak detector 182 is an input of AGC 130 and monitors $V_{180}$ to provide a voltage to the first inputs of comparators 184-190 corresponding to the peak value of $V_{180}$. Comparators 184-190 compare the output of peak detector 182 with reference voltages developed by resistors 162-170.

If $I_{IN}$ is less than 50 µa, then there is no data signal and AGC 130 continues to wait until the next RESET cycle. In the present example, peak detector 182 determines that the magnitude of input current $I_{IN}$ is greater than 50 µa, which causes the output voltage of peak detector 182 to exceed the 40 mv threshold of comparator 184. The output signal of comparator 184 goes to logic one. Latch 192 stores the logic one from comparator 184 and triggers pulse generator 194 to generate a 25 ns pulse as AGC CONTROL waveform 234 in FIG. 5. AGC CONTROL (output of pulse generator 194) enables latches 196, 198, and 200. Assuming the output voltage of peak detector 182 is less than the thresholds of comparators 186-190, then the output of comparators 186-190 is logic zero and the output of latches 196-200 is logic zero, and transistors 202-206 are all non-conductive. The resistance across front-end amplifier 150 is the series sum of resistors 210-216, i.e., $R_{210}+R_{212}+R_{214}+R_{216}$. Front-end amplifier 150 has maximum gain given by the feedback resistance $R_{210}+R_{212}+R_{214}+R_{216}$ corresponding to the minimum input current $I_{IN}$.

If the magnitude of input current $I_{IN}$ is greater than 150 µa, then the output voltage of peak detector 182 exceeds the 200 mv threshold of comparator 186. The output of comparator 186 goes to logic one, which is stored in latch 196. Assume the output voltage of peak detector 182 does not exceed the thresholds of comparators 188 and 190. The logic one from latch 196 turns on transistor 202, and the logic zeros from latches 198 and 200 turn off transistors 204-206. The conductive transistor 202 disables resistor 210, i.e., the conductive path through resistor 210 is shorted by the low drain-source resistance of transistor 202. The resistance across front-end amplifier 150 is the series sum of resistors 212-216, i.e., $R_{212}+R_{214}+R_{216}$. Front-end amplifier 150 has a lesser gain given by the feedback resistance $R_{212}+R_{214}+R_{216}$ corresponding to the larger magnitude of input current $I_{IN}$.

If the magnitude of input current $I_{IN}$ is greater than 300 µa, then the output voltage of peak detector 182 exceeds the 250 mv threshold of comparator 188. The output of comparator 188 goes to logic one, which is stored in latch 198. Assume the output voltage of peak detector 182 does not exceed the thresholds of comparator 190. The logic one from latches 196 and 198 turn on transistors 202 and 204, and the logic zero from latch 200 turns off transistor 206. The conductive transistor 204 disables resistor 212, i.e., the conductive path through resistor 212 is shorted by the low drain-source resistance of transistor 204. The resistance across front-end amplifier 150 is the series sum of resistors 214-216, i.e., $R_{214}+R_{216}$. Front-end amplifier 150 has a lesser gain given by the feedback resistance $R_{214}+R_{216}$ corresponding to a larger magnitude of input current $I_{IN}$.

If the magnitude of input current $I_{IN}$ is greater than 500 µa, then the output voltage of peak detector 182 exceeds the 350 mv threshold of comparator 188. The output of comparator 190 goes to logic one, which is stored in latch 200. The logic one from latches 196-200 turn on transistors 202-206. The conductive transistor 206 disables resistor 214, i.e., the conductive path through resistor 214 is shorted by the low drain-source resistance of transistor 206. The resistance across front-end amplifier 150 is the resistor 216, i.e., $R_{216}$. Front-end amplifier 150 has a minimum gain given by the feedback resistance $R_{216}$ corresponding to the maximum input current $I_{IN}$.

When AGC CONTROL goes to logic zero in FIG. 5 (end of 25 ns pulse from 194), AGC 130 is locked with the proper gain, given the input current $I_{IN}$. The input current $I_{IN}$ 148 is processed through BM TIA 124, with the proper gain for the given speed, during the payload portion of the burst mode data packet after time $t_2$. AGC 130 is reset for the next burst mode during the guard time and the proper gain for the given speed is again set, as described above. The time required to set the gain of AGC 130 is 25.6 ns for 10 G mode and 12.8 ns for 2.5 G mode, which is faster than the prior art implementations. AGC 130 supports the lock time requirements of GPON 100, i.e., BM TIA 124 settles within 25 ns after time t1, during the preamble portion of the burst mode data packet. AGC 130 provides stable operation of BM TIA 124. AGC 130 is shown with four gain stages, although additional gain stages like 190, 200, 206, and 216 can be added.

While one or more embodiments of the present invention have been illustrated in detail, the skilled artisan will appreciate that modifications and adaptations to those embodiments may be made without departing from the scope of the present invention as set forth in the following claims.

What is claimed:

1. An automatic gain control circuit for controlling a gain of an amplifier, comprising:
    a peak detector including an input coupled to an output of the amplifier;
    a first comparator including a first input coupled to an output of the peak detector and a second input coupled for receiving a first reference voltage;
    a first conduction path including a first switching circuit with a control input of the first switching circuit coupled to an output of the first comparator, wherein a first terminal of the first conduction path is coupled to the output of the amplifier; and
    a first resistor including a first terminal coupled to an input of the amplifier and a second terminal coupled to a second terminal of the first conduction path.

2. The automatic gain control circuit of claim 1, wherein the first switching circuit includes:
    a latch including a data input coupled to the output of the first comparator; and
    a transistor including a first conduction terminal coupled to the second terminal of the first resistor, a second conduction terminal coupled to the output of the amplifier, and a control input coupled to an output of the latch.

3. The automatic gain control circuit of claim 2, further including:
    a second comparator including a first input coupled to the output of the peak detector and a second input coupled for receiving a second reference voltage; and
    a pulse generator including an input coupled to an output of the second comparator and an output coupled to an enable input of the latch.

4. The automatic gain control circuit of claim 1, further including:
    a second comparator including a first input coupled to the output of the peak detector and a second input coupled for receiving a second reference voltage;
    a second conduction path including a second switching circuit with a control input of the second switching circuit coupled to an output of the second comparator, wherein a first terminal of the second conduction path is coupled to the output of the amplifier; and
    a second resistor including a first terminal coupled to the second terminal of the first resistor and a second terminal coupled to a second terminal of the second conduction path.

5. The automatic gain control circuit of claim 4, further including:
    a third comparator including a first input coupled to the output of the peak detector and a second input coupled for receiving a third reference voltage;
    a third conduction path including a third switching circuit with a control input of the third switching circuit coupled to an output of the third comparator, wherein a first terminal of the third conduction path is coupled to the output of the amplifier; and
    a third resistor including a first terminal coupled to the second terminal of the second resistor and a second terminal coupled to a second terminal of the third conduction path.

6. The automatic gain control circuit of claim 5, further including a fourth resistor coupled between the second terminal of the third resistor and the output of the amplifier.

7. An automatic gain control circuit for controlling a gain of a first amplifier, comprising:
    a peak detector including an input coupled to an output of the first amplifier;
    a plurality of resistors coupled in series between an input of the first amplifier and the output of the first amplifier for setting the gain of the first amplifier;
    a first gain stage responsive to an output signal of the peak detector for disabling a first resistor of the plurality of resistors to alter the gain of the first amplifier, wherein the first gain stage includes,
        (a) a first comparator including a first input coupled to an output of the peak detector and a second input coupled for receiving a first reference voltage,
        (b) a first conduction path including a first switching circuit with a control input of the first switching circuit coupled to an output of the first comparator, wherein a first terminal of the first conduction path is coupled to the output of the amplifier, and
        (c) the first resistor of the plurality of resistors including a first terminal coupled to an input of the amplifier and a second terminal coupled to a second terminal of the first conduction path; and
    a second gain stage responsive to the output signal of the peak detector for disabling a second resistor of the plurality of resistors to alter the gain of the first amplifier.

8. The automatic gain control circuit of claim 7, wherein the first switching circuit includes:
    a latch including a data input coupled to the output of the first comparator; and
    a transistor including a first conduction terminal coupled to the first resistor, a second conduction terminal coupled to the output of the first amplifier, and a control input coupled to an output of the latch.

9. The automatic gain control circuit of claim 8, wherein the latch includes a reset input coupled for receiving a reset signal.

10. The automatic gain control circuit of claim 8, further including:
 a second comparator including a first input coupled to the output of the peak detector and a second input coupled for receiving a second reference voltage; and
 a pulse generator including an input coupled to an output of the second comparator and an output coupled to an enable input of the latch.

11. The automatic gain control circuit of claim 7, wherein the second gain stage includes:
 a second comparator including a first input coupled to the output of the peak detector and a second input coupled for receiving a reference voltage; and
 a second conduction path including a second switching circuit with a control input of the second switching circuit coupled to an output of the second comparator, wherein the second conduction path disables the second resistor.

12. The automatic gain control circuit of claim 7, further including:
 a second amplifier; and
 a resistor divider network coupled between an output of the second amplifier and a power supply terminal for generating a plurality of reference voltages.

13. A method of making an automatic gain control circuit for controlling a gain of a first amplifier, comprising:
 providing a peak detector including an input coupled to an output of the first amplifier;
 providing a plurality of resistors coupled in series between an input of the first amplifier and the output of the first amplifier for setting the gain of the first amplifier;
 providing a first gain stage responsive to an output signal of the peak detector for disabling a first resistor of the plurality of resistors to alter the gain of the first amplifier, wherein the first gain stage includes,
  (a) a first comparator including a first input coupled to an output of the peak detector and a second input coupled for receiving a first reference voltage,
  (b) a first conduction path including a first switching circuit with a control input of the first switching circuit coupled to an output of the first comparator, wherein a first terminal of the first conduction path is coupled to the output of the amplifier, and
  (c) the first resistor of the plurality of resistors including a first terminal coupled to an input of the amplifier and a second terminal coupled to a second terminal of the first conduction path; and
 providing a second gain stage responsive to the output signal of the peak detector for disabling a second resistor of the plurality of resistors to alter the gain of the first amplifier.

14. The method of claim 13, wherein providing the first switching circuit includes:
 providing a latch including a data input coupled to the output of the first comparator; and
 providing a transistor including a first conduction terminal coupled to the first resistor, a second conduction terminal coupled to the output of the first amplifier, and a control input coupled to an output of the latch.

15. The method of claim 14, wherein the latch includes a reset input coupled for receiving a reset signal.

16. The method of claim 14, further including:
 providing a second comparator including a first input coupled to the output of the peak detector and a second input coupled for receiving a second reference voltage; and
 providing a pulse generator including an input coupled to an output of the second comparator and an output coupled to an enable input of the latch.

17. The method of claim 13, wherein the second gain stage includes:
 providing a second comparator including a first input coupled to the output of the peak detector and a second input coupled for receiving a reference voltage; and
 providing a second conduction path including a second switching circuit with a control input of the second switching circuit coupled to an output of the second comparator, wherein the second conduction path disables the second resistor.

18. The method of claim 13, further including:
 providing a second amplifier; and
 providing a resistor divider network coupled between an output of the second amplifier and a power supply terminal for generating a plurality of reference voltages.

19. The method of claim 17, wherein the second switching circuit includes:
 a latch including a data input coupled to the output of the second comparator; and
 a transistor including a first conduction terminal coupled to the second resistor, a second conduction terminal coupled to the output of the first amplifier, and a control input coupled to an output of the latch.

20. The automatic gain control circuit of claim 11, wherein the second switching circuit includes:
 a latch including a data input coupled to the output of the second comparator; and
 a transistor including a first conduction terminal coupled to the second resistor, a second conduction terminal coupled to the output of the first amplifier, and a control input coupled to an output of the latch.

* * * * *